United States Patent [19]

Hajduk

[11] 4,107,457
[45] Aug. 15, 1978

[54] TRANSFER TERMINAL WITH LIBRARY PHRASE MEMORY

[75] Inventor: Thomas M. Hajduk, Torrance, Calif.

[73] Assignee: TRW Inc., Los Angeles, Calif.

[21] Appl. No.: 799,143

[22] Filed: May 23, 1977

[51] Int. Cl.² .................. G11C 17/00; H04L 13/08
[52] U.S. Cl. ........................... 178/17.5; 178/2 R; 178/79
[58] Field of Search ............. 178/17.5, 2 R, 3, 26 R, 178/79, 23 R

[56] References Cited

U.S. PATENT DOCUMENTS

| 2,770,304 | 11/1956 | Tholstrup | 178/17.5 |
| 3,059,048 | 10/1962 | Lamin et al. | 178/17.5 |
| 3,912,863 | 10/1975 | Patience | 178/26 R |

FOREIGN PATENT DOCUMENTS 2,519,086  11/1976  Fed. Rep. of Germany ......... 178/17.5

*Primary Examiner*—Thomas A. Robinson
*Attorney, Agent, or Firm*—Martin R. Horn

[57] ABSTRACT

A data transfer terminal of the type including a keyboard means, a display means and a printer for use in a data center controlled data transfer system. The printer of the data transfer terminal is provided with a library phrase memory. The library phrase memory contains a plurality of predetermined, commonly used phrases at various predetermined addresses in the library phrase memory. The addresses of the phrases correspond to codes which are included in messages sent by the data center to the data transfer terminal whereby the length of the messages from the data center to be printed by the printer of the data transfer terminal is greatly reduced.

9 Claims, 3 Drawing Figures

|  | ROM HEX LOCATION | HEX STARTING ADDRESS CHAR. 2nd 1st yx |  |  | ROM HEX LOCATION | HEX STARTING ADDRESS CHAR. 2nd 1st yx |
|---|---|---|---|---|---|---|
| Account | 010 | 40 | | Final Payment | 0F0 | 47 |
| Accrued | 018 | 60 | | Interest | 100 | 80 |
| Address | 020 | 01 | | Limit | 108 | A0 |
| Amount | 028 | 21 | | Name | 074 | 53 |
| Approved | 030 | 41 | | Number | 120 | 81 |
| Authorized | 170 | C3 | | Outstanding | 150 | C2 |
| Available | 190 | C4 | | Overdrawn | 130 | C1 |
| Average | 050 | 42 | | Overdue | 03C | 71 |
| Balance | 058 | 62 | | Owed | 140 | 82 |
| Billed | 060 | 03 | | Paid | 148 | A2 |
| Cancelled | 1B0 | C5 | | Payment | 160 | 83 |
| Card | 038 | 61 | | Please | 168 | A3 |
| Cash | 078 | 63 | | Price | 180 | 84 |
| Change | 07C | 73 | | Payable | 188 | A4 |
| Check | 084 | 14 | | Receipt | 1A0 | 85 |
| Closed | 08C | 34 | | Sales | 1A8 | A5 |
| Collected | 1D0 | C6 | | State | 1C0 | 86 |
| Completed | 068 | 23 | | Stock | 1C8 | A6 |
| Credit | 0A0 | 05 | | Tax | 14C | B2 |
| Data | 0AS | 25 | | Thank You | 044 | 12 |
| Debit | 0AC | 35 | | Transaction | 1F0 | C7 |
| Deduction | 0B4 | 55 | | Transfer | 128 | A1 |
| Delete | 0C0 | 06 | | Transferred | 110 | C0 |
| Demand | 0C8 | 26 | | Unpaid | 1E0 | 87 |
| Deposit | 0D0 | 46 | | Withdrawal | 094 | 54 |
| Discount | 0D8 | 66 | | Year | 144 | 92 |
| Dividend | 0E0 | 07 | | Yield | 1E8 | A7 |
| Earned | 0E8 | 27 | | This is a test | 000 | 00 |

*Fig. 3*

TRANSFER TERMINAL WITH LIBRARY PHRASE MEMORY

FIELD OF INVENTION

This invention relates to data transfer systems and more particularly to data transfer terminals.

DESCRIPTION OF THE PRIOR ART

In the prior art there exist several data transfer systems. Such data transfer systems include a data center which is in communication with a plurality of data transfer terminals. In such prior art systems, the data transfer terminals transmit information to the data center. The information received by the data center is utilized for several purposes, such as updating the information contained in the data center and usually results in a message being returned to the data transfer terminal. Such information received from the data center is typically printed on paper by a printer as part of the data transfer terminal. The printer is indirectly controlled by the message from the data center. Accordingly, if words are being printed by the printer located in the data transfer terminal as part of the message sent by the data center, typically the data center is tied up for relatively long periods of time. Since the data center is tied up for relatively long periods of time, the number of transfer terminals which can efficiently operate in conjunction with a single data center is greatly reduced and the total efficiency of the data transfer system is low.

Accordingly, it is a general object of the present invention to provide a data transfer terminal which allows the message from the data center to be greatly reduced.

It is another object of the present invention to provide a data transfer system which allows a greater number of data transfer terminals to be utilized in conjunction with a single data center.

SUMMARY OF THE INVENTION

In keeping with the principles of the present invention, the objects are accomplished by a unique data transfer terminal of the type including a keyboard means, a display means and a printer for use in a data center controlled data transfer system. The printer of the data terminal is provided with a library phrase memory. The library phrase memory contains a plurality of predetermined commonly used phrases at various predetermined addresses in the library phrase memory. The addresses of the phrases correspond to codes which are included in messages sent by the data center to the data transfer terminal whereby the length of the message from the data center to be printed on the printer of the data transfer terminal is greatly reduced.

In the preferred embodiment, the library phrase memory comprises a pre-programmed integrated circuit read only memory.

BRIEF DESCRIPTION OF THE DRAWINGS

The above mentioned and other features and objects of the present invention will become more apparent by reference to the following description taken in conjunction with the accompanying drawings, wherein like reference numerals denote like elements, and in which:

FIG. 3 is a table illustrating one example of commonly used library phrases and their corresponding code.

DESCRIPTION OF THE INVENTION

Figure 1:
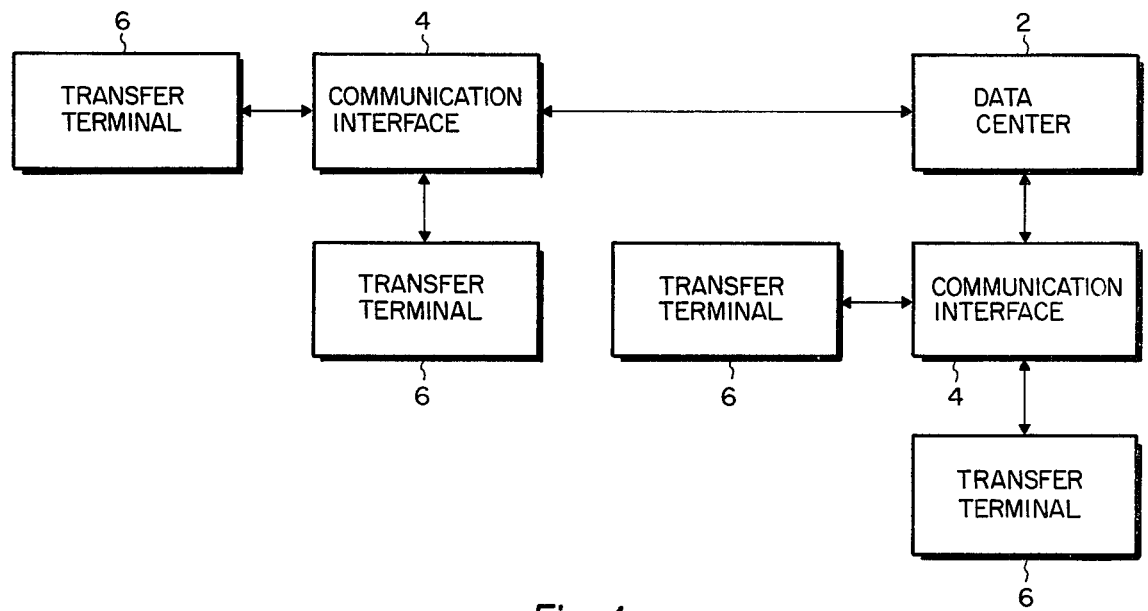
FIG. 1 is a block diagram of a data center controlled data transfer system.

Referring more particularly to the figures, shown in FIG. 1 is a data center controlled data transfer system. The data transfer system comprises a data center 2 which is in communication with a plurality of communication interfaces 4. Each of the communication interfaces 4 are in communication with a plurality of data transfer terminals 6.

In operation, information is entered into a data transfer terminal 6 and transmitted to the data center 2 via a communication interface 4. Essentially, the communication interface 4 performs a buffering and routing function to ensure that the data is routed to the right place at the right time and at the right levels. After the data center 2 receives the information, it responds by sending a message back to the appropriate data transfer terminal 6 via the communication interface 4. Some of the information transmitted from the data center 2 which is in the form of a message is displayed on the data transfer terminal while other of the information is printed on a permanent record by a printer located in the data transfer terminal 6.

Figure 2:
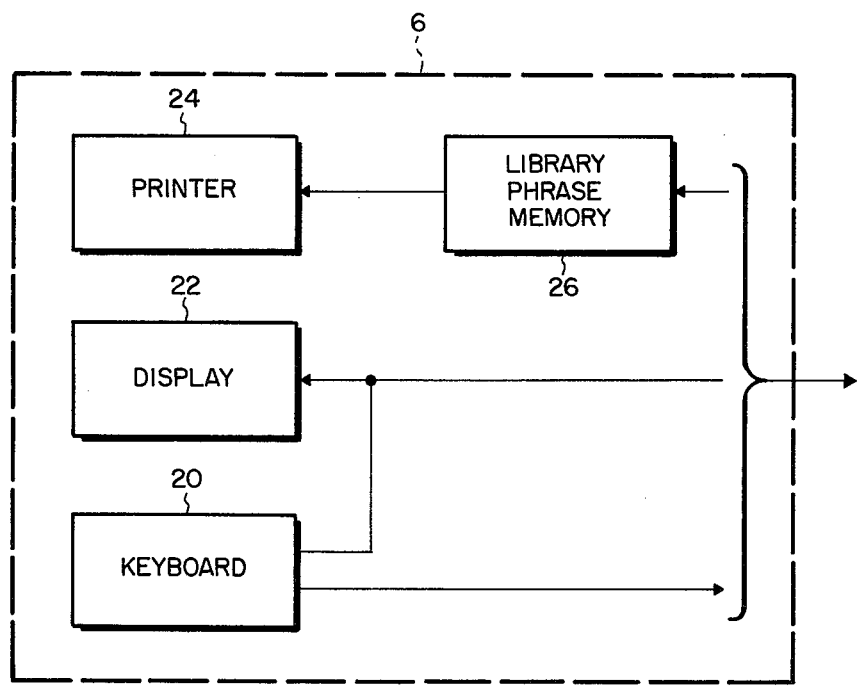
FIG. 2 is a block diagram of a data transfer terminal in accordance with the teachings of the present invention.

Referring to FIG. 2, shown therein is a block diagram of a data transfer terminal 6 in accordance with the teachings of the present invention. The data transfer terminal 6 includes a keyboard 20 and a display 22. The keyboard 20 not only transmits information to the data center 2 via the communication interface 4 but also supplies information to the display 22. In addition, the data transfer terminal 6 includes a printer 24 coupled to a library phrase memory 26. The printer 24, display 22 and keyboard 20 are state of the art. The printer 24 includes a small memory capability and both the library phrase memory 26 and the display receive information or data from the data center 2 while the keyboard 20 transmits data to the data center 2.

The display 22 not only displays such things as numeric information but also displays other functions such as error messages and control signals. The keyboard 20 includes keys such as 0 to 9 and sequence control keys.

In operation, a user would enter information on the keyboard 20. Such information would be transmitted via the communication interface 4 to the data center 2. The information or data transferred could be of at least two types, one type which would require a response from the data center 2 and one type which does not. If the data which is transmitted from the keyboard 20 to the data center 2 is of the type which requires a response from the data center 2, the response from the data center 2 would be of two types. The first type would be a message which is not required to be reduced to a permanent record, such as an error signal or an authorization signal and would usually be displayed on the display 22. The second type would be the type of information or data which would be required to be reduced to a permanent record by the printer 24.

In the data transfer system utilizing a data transfer terminal in accordance with the teachings of the present invention, the type of message which must be reduced to a permanent record by the printer 24 does not include commonly used alpha phrases. Instead, the message from the data center 2 includes a short code which corresponds to an address location in the library phrase memory 26. A listing of examples of such codes and the corresponding common phrase is given in FIG. 3. The library phrase memory 26 has a plurality of predetermined, commonly used phrases stored therein at a plurality of predetermined addresses which correspond to the codes sent in the messages from the data center 2. Accordingly, when a message is received from the data center 2 which includes such codes, the printer 24 is caused to print the phrase stored in the library phrase memory 26 instead of the code. In this way, the messages from the data center 2 are greatly reduced thereby greatly reducing the time required to transmit the message from the data center 2 to the data transfer terminal 6. In this way the efficiency of the overall data transfer system is increased and the total number of data transfer terminals 6 which can be utilized with a given data center 2 is increased. Since the total number of data transfer terminals 6 which can be utilized with a given data center 2 is increased, the cost of the data center 2 can be divided among more data transfer terminals 6 thereby reducing the overall cost to each of the users of the tranfer terminal 6.

It should be apparent to one skilled in the art that in some applications, the data transfer terminal 6 may not require all of the previously described elements or may include many other elements, such as additional displays, keyboards, a card reader and a tape reader. Furthermore, in some specialized applications it should be apparent to one skilled in the art that the data transfer terminal 6 might only include a printer 24 together with a library phrase memory 26.

In all cases it is understood that the above described embodiment is merely illustrative of but a small number of the many possible specific embodiments which can represent applications of the principles of the present invention. Numerous and varied other arrangements can be readily devised in accordance with these principles by those skilled in the art without departing from the spirit and scope of the invention.

I claim:

1. A data transfer terminal of the type including a printer for printing out messages received from a remotely located data center, said data center providing different messages independently to a plurality of like data transfer terminals in a controlled data transfer system, said data transfer terminal being characterized by:
   a library phrase memory containing a plurality of predetermined phrases at respective predetermined addresses in said library phrase memory, said addresses of said phrases corresponding respectively to a plurality of phrase address codes any of which may be included in a message sent by said data center to said transfer terminal, and
   coupling control means, coupling said library phrase memory and said printer and responsive to messages received from said remotely located data center, for accessing from said memory the phrase stored at each address corresponding to a phrase address code included in said received message and for causing said printer to print out said accessed phrases, whereby the length of said message from said data center to be printed on said printer is greatly reduced in comparison with transmission from said data center of the full text to be printed.

2. A data transfer terminal according to claim 1 wherein said library phrase memory is a read only memory, and wherein each phrase address code is itself the address of the location in said memory at which the corresponding phrase is stored, so that no address decoding is required.

3. A data transfer terminal according to claim 2 wherein said read only memory is a pre-programmed integrated circuit having hexadecimal storage locations each corresponding to a hexidecimal phrase address code.

4. A data transfer terminal according to claim 1 wherein said received message also may contain characters to be printed, and wherein said coupling control means causes said printer to print out these characters in addition to the phrases accessed from said library phrase memory.

5. A data transfer terminal according to claim 4 wherein said printer includes a small memory capability, said characters being stored in said small memory for printout in conjunction with said accessed phrases.

6. A data transfer terminal of the type including at least a keyboard means, a display means and a printer for use in a data center controlled data transfer system, said data transfer terminal being characterized by:
   a library phrase memory containing a plurality of predetermined phrases at predetermined addresses therein, said library phrase memory being coupled to said printer, said addresses of said phrases each corresponding to a unique phrase address code which may be included in a message sent by said data center to said transfer terminal,
   code detection means, connected to said library phrase memory and connected to receive messages from said data center, for ascertaining the presence of a phrase address code in a received message, and
   memory access means, cooperating with said code detection means and said library phrase memory, for accessing from said memory the phrase stored at a location identified by the phrase address code present in a received message and for causing said accessed phrase to be printed by said printer, whereby the length of a message from said data center to be printed on said printer is greatly reduced.

7. A data transfer terminal according to claim 6 wherein said library phrase memory is a read only memory.

8. A data transfer terminal according to claim 6 wherein said predetermined phrases comprise a plurality of commonly used phrases, each of said phrases having a number of characters greater than the number of characters in the phrase address code associated therewith.

9. A data transfer terminal according to claim 6 wherein said read only memory is a pre-programmed integrated circuit.

* * * * *